US010276442B1

(12) United States Patent
Xie et al.

(10) Patent No.: US 10,276,442 B1
(45) Date of Patent: Apr. 30, 2019

(54) WRAP-AROUND CONTACTS FORMED WITH MULTIPLE SILICIDE LAYERS

(71) Applicant: GLOBALFOUNDRIES Inc., Grand Cayman (KY)

(72) Inventors: Ruilong Xie, Niskayuna, NY (US); Julien Frougier, Albany, NY (US); Kangguo Cheng, Schenectady, NY (US); Adra Carr, Albany, NY (US); Nicolas Loubet, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/993,017

(22) Filed: May 30, 2018

(51) Int. Cl.
*H01L 29/76* (2006.01)
*H01L 21/8234* (2006.01)
*H01L 27/088* (2006.01)
*H01L 21/8238* (2006.01)
*H01L 29/423* (2006.01)
*H01L 29/786* (2006.01)

(52) U.S. Cl.
CPC ........ *H01L 21/823418* (2013.01); *H01L 21/823412* (2013.01); *H01L 21/823814* (2013.01); *H01L 27/088* (2013.01); *H01L 29/42392* (2013.01); *H01L 29/78696* (2013.01)

(58) Field of Classification Search
CPC ..... H01L 21/823814; H01L 21/823481; H01L 27/088; H01L 21/823412; H01L 21/823418; H01L 29/42392; H01L 29/78696

USPC ........................................................ 257/401
See application file for complete search history.

(56) References Cited

U.S. PATENT DOCUMENTS

| 7,163,864 B1 | 1/2007 | Adkisson et al. |
| 9,070,783 B2* | 6/2015 | Yamakawa ..... H01L 21/823807 |
| 9,390,981 B1* | 7/2016 | Basker ............ H01L 21/823814 |
| 9,847,390 B1 | 12/2017 | Xie et al. |
| 9,847,391 B1* | 12/2017 | Zang ................... H01L 29/0673 |
| 2013/0267046 A1 | 10/2013 | Or-Bach et al. |

OTHER PUBLICATIONS

Breil et al., "Highly-selective superconformal CVD Ti silicide process enabling area-enhanced contacts for next-generation CMOS architectures", 2017 Symposium on VLSI Technology, Kyoto, 2017, pp. T216-T217.

* cited by examiner

*Primary Examiner* — Luan C Thai
(74) *Attorney, Agent, or Firm* — Thompson Hine LLP; Anthony Canale

(57) ABSTRACT

Structures for a field-effect transistor and methods of forming structures for a field-effect transistor. A first field-effect transistor has a first source/drain region, and a second field-effect transistor has a second source/drain region. A first silicide layer is arranged to wrap around the first source/drain region, and a second silicide layer is arranged to wrap around the second source/drain region. The first silicide layer contains a first metal, and the second silicide layer contains a second metal different from the first metal.

20 Claims, 17 Drawing Sheets

WRAP-AROUND CONTACTS FORMED WITH MULTIPLE SILICIDE LAYERS

BACKGROUND

The present invention relates to semiconductor device fabrication and integrated circuits and, more specifically, to structures for a field-effect transistor and methods of forming a structure for a field-effect transistor.

Device structures for a field-effect transistor generally include a source, a drain, and a gate electrode configured to switch carrier flow in a channel formed in a semiconductor body arranged between the source and drain. The semiconductor body and channel of a planar field-effect transistor are arranged beneath the top surface of a substrate on which the gate electrode is supported. When a control voltage exceeding a designated threshold voltage is applied to the gate electrode, the flow of carriers in the channel produces a device output current.

A fin-type field-effect transistor is a non-planar device structure that may be more densely packed in an integrated circuit than planar field-effect transistors. A fin-type field-effect transistor may include a fin, a source and a drain, and a gate electrode that wraps about a channel located in the fin between the source and the drain. The arrangement between the gate structure and fin may improve control over the channel and reduce the leakage current when the fin-type field-effect transistor is in its 'Off' state in comparison with a planar transistor. This, in turn, may enable the use of lower threshold voltages than in planar transistors, and may result in improved performance and lowered power consumption.

Nanosheet field-effect transistors have been developed as another type of non-planar field-effect transistor that may permit additional increases in packing density in an integrated circuit. The body of a nanosheet field-effect transistor includes multiple nanosheet channel layers that are arranged in a layer stack. The nanosheet channel layers are initially arranged in a layer stack with sacrificial layers containing a material (e.g., silicon-germanium) that can be etched selectively to the material (e.g., silicon) constituting the nanosheet channel layers. The sacrificial layers are etched and removed in order to release the nanosheet channel layers and to provide spaces for the formation of a gate stack. Sections of the gate stack may surround all sides of the individual nanosheet channel layers in a gate-all-around arrangement.

Epitaxial semiconductor material is epitaxially grown from the nanosheet channel layers to form source and drain regions of a nanosheet field-effect transistor. The epitaxial semiconductor material is covered by a silicide material to facilitate electrical connections with contacts extending to contact the respective top surfaces of the source and drain regions. The same silicide material may be concurrently applied to the n-type epitaxial semiconductor material forming the source and drain regions of n-type nanosheet field-effect transistors and the p-type epitaxial semiconductor material forming the source and drain regions of p-type nanosheet field-effect transistors.

SUMMARY

In embodiments of the invention, a method includes epitaxially growing a first source/drain region of a first field-effect transistor, epitaxially growing a second source/drain region of a second field-effect transistor, epitaxially growing a first epitaxial semiconductor layer arranged to wrap around the first source/drain region, and epitaxially growing a second epitaxial semiconductor layer arranged to wrap around the second source/drain region. The method further includes forming an interlayer dielectric layer over the first source/drain region and the second source/drain region, and forming a first opening extending through the interlayer dielectric layer to the first epitaxial semiconductor layer and a second opening extending through the interlayer dielectric layer to the second epitaxial semiconductor layer. The first opening provides access to the first epitaxial semiconductor layer, and the second opening provides access to the second epitaxial semiconductor layer. The method further includes removing the first epitaxial semiconductor layer selective to the second epitaxial semiconductor layer and the first source/drain region with a first selective etching process and, after removing the first epitaxial semiconductor layer, forming a first silicide layer that is arranged to wrap around the first source/drain region. The method further includes removing the second epitaxial semiconductor layer selective to the second source/drain region with a second selective etching process and, after removing the second epitaxial semiconductor layer, forming a second silicide layer arranged to wrap around the second source/drain region. The first epitaxial semiconductor layer has a first composition, the second epitaxial semiconductor layer has a second composition different from the first composition, the first silicide layer includes a first metal, and the second silicide layer includes a second metal different from the first metal.

In embodiments of the invention, a structure includes a first field-effect transistor with a first source/drain region having a top surface and one or more side surfaces, and a second field-effect transistor with a second source/drain region having a top surface and one or more side surfaces. A first contact includes a lower portion coupled with the first source/drain region and an upper portion coupled by the lower portion with the first source/drain region. The lower portion of the first contact includes a first silicide layer arranged to wrap around the top surface and the one or more side surfaces of the first source/drain region. The upper portion of the first contact includes a first portion of a metallization layer. A second contact includes a lower portion coupled with the second source/drain region and an upper portion coupled by the lower portion with the second source/drain region. The lower portion of the second contact includes a second silicide layer arranged to wrap around the top surface and the one or more side surfaces of the second source/drain region. The upper portion of the second contact includes a second portion of the metallization layer. The first silicide layer includes a first metal, the first silicide layer includes a second metal different from the first metal, and the first portion and the second portion of the metallization layer includes a third metal different from the first metal and the second metal.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

FIG. 4D is a top view in which FIG. 4 is taken generally along line 4-4 and FIG. 4B is taken generally along line 4B-4B.

FIG. 5D is a top view in which FIG. 5A is taken generally along line 5A-5A and FIG. 5C is taken generally along line 5C-5C.

DETAILED DESCRIPTION

With reference to FIGS. 1, 2, 2A, 2B, 2C and in accordance with embodiments of the invention, nanosheet channel layers 10 and sacrificial layers 12 are arranged in patterned layer stack 16 on a substrate 14. The substrate 14 may be composed of a semiconductor material, such as single-crystal silicon. The nanosheet channel layers 10 and sacrificial layers 12 may be formed on the substrate 14 by an epitaxial growth process during which the composition is alternated through variation of the reactants, and may be patterned using a lithography and etching process. The number of nanosheet channel layers 10 and sacrificial layers 12 may differ from the number in the depicted representative embodiment and, in particular, may be greater than the number in the representative embodiment through the addition of pairs of nanosheet channel layers 10 and sacrificial layers 12 to the patterned layer stack 16.

The nanosheet channel layers 10 are composed of a semiconductor material, and the sacrificial layers 12 are composed of a semiconductor material with a composition that is selected to be removed selective to the semiconductor material of the nanosheet channel layers 10. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In an embodiment, the semiconductor material constituting the nanosheet channel layers 10 may be silicon (Si), and the semiconductor material constituting the sacrificial layers 12 may be silicon-germanium (SiGe) that etches at a higher rate than silicon due to the germanium content. In an embodiment, the germanium content of the sacrificial layers 12 may range from twenty percent (20%) to thirty-five percent (35%).

Figure 1:
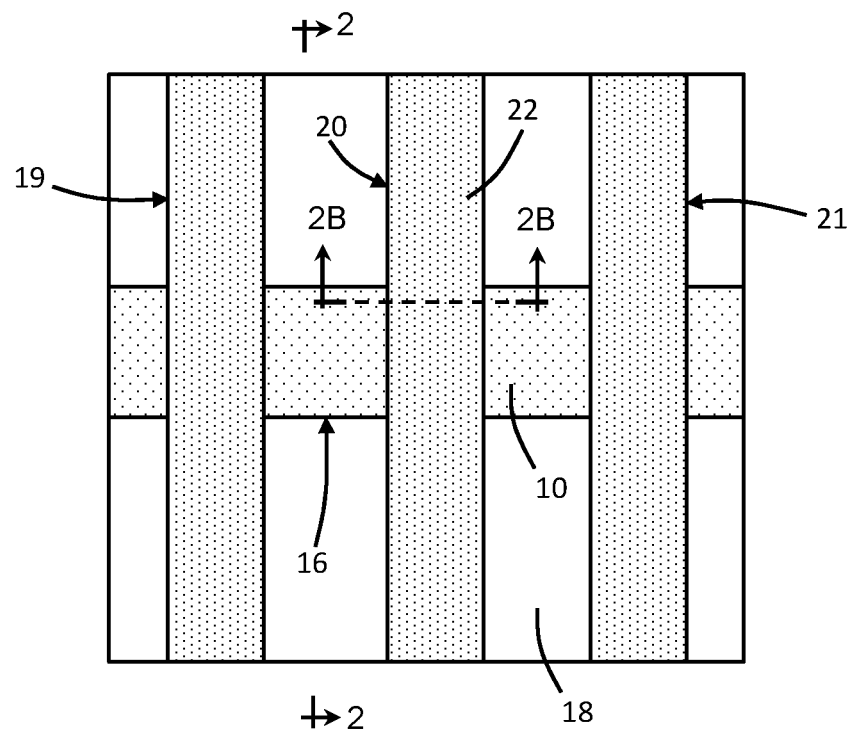
FIG. 1 is a top view of a device structure at an initial fabrication stage of the processing method in accordance with embodiments of the invention.
Figure 2:
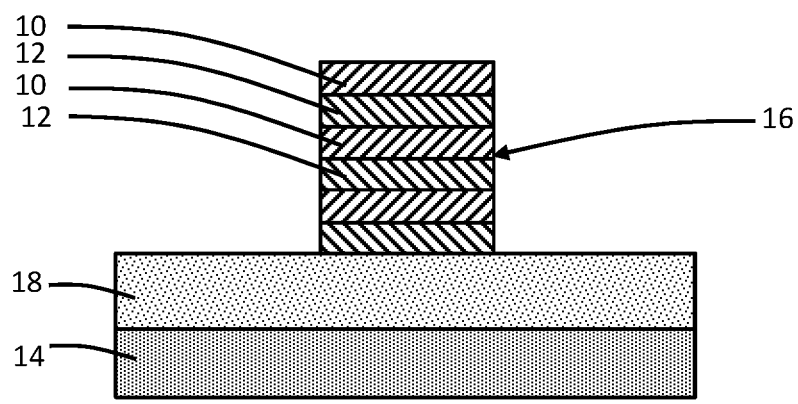
FIG. 2 is a cross-sectional view taken generally along line 2-2 in FIG. 1.
Figure 2A:
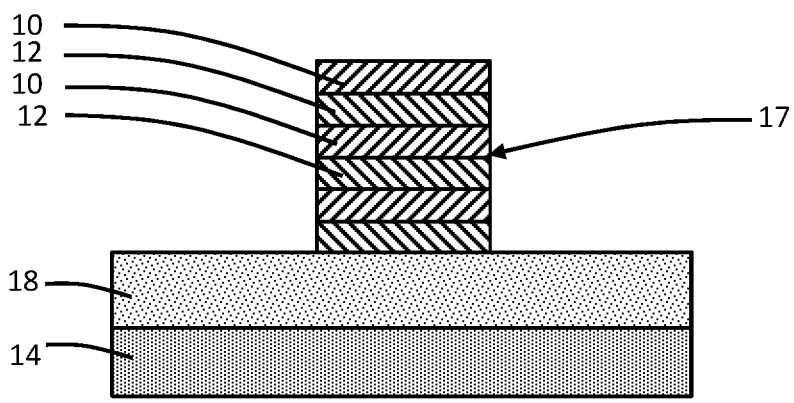
FIG. 2A is a cross-sectional view similar to FIG. 2 in which another layer stack of nanosheet channel layers and sacrificial layers is shown.
Figure 2B:
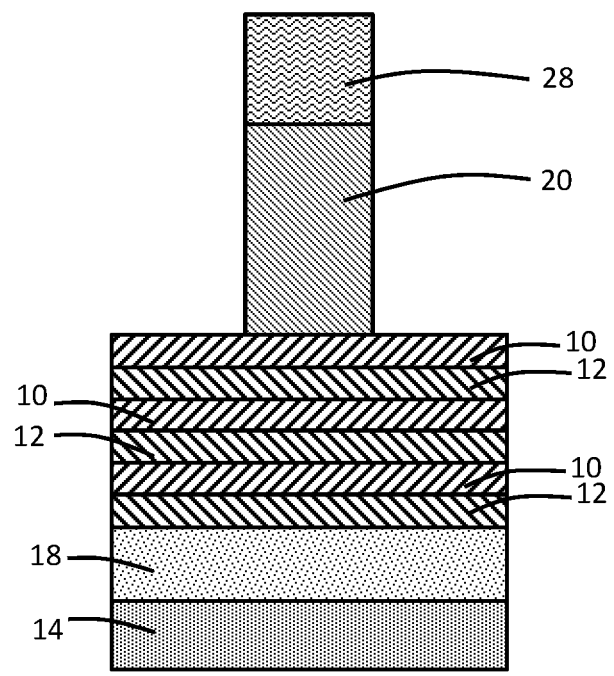
FIG. 2B is a cross-sectional view taken generally along line 2B-2B in FIG. 1.
Figure 2C:
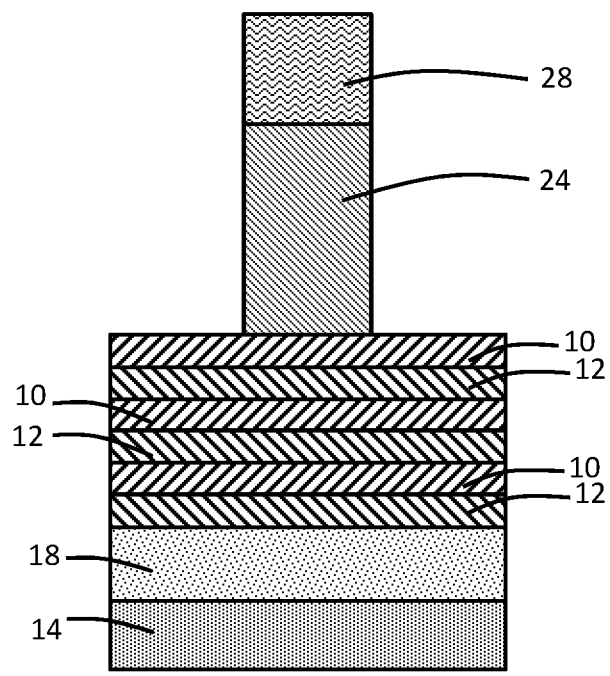
FIG. 2C is a cross-sectional view similar to FIG. 2B in which another sacrificial gate structure is shown overlapped with the layer stack of FIG. 2A.
Figure 3:
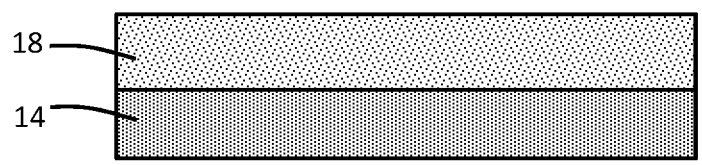
FIGS. 3, 3A, 3B, and 3C are cross-sectional views of the device structure at a fabrication stage of the processing method subsequent to FIGS. 2, 2A, 2B, and 2C.
Figure 3A:
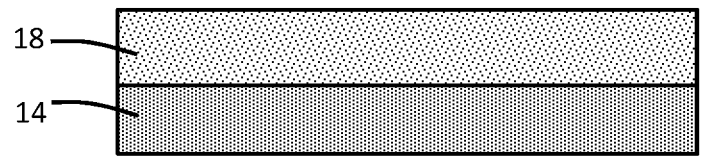
Figure 3B:
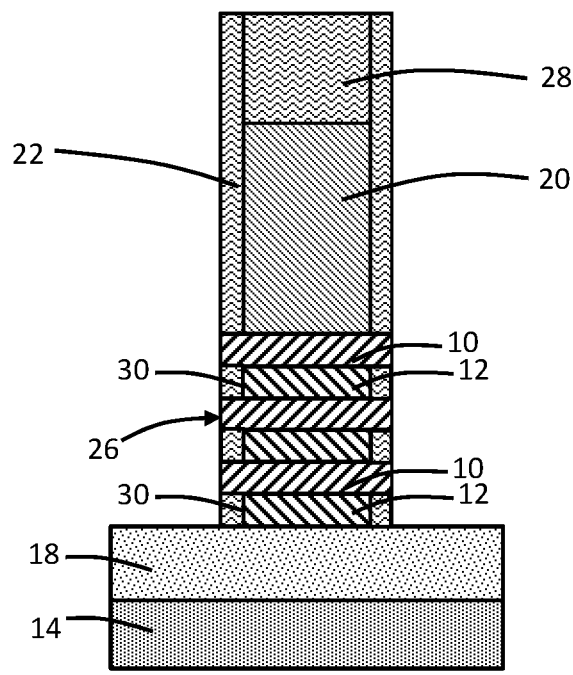
Figure 3C:
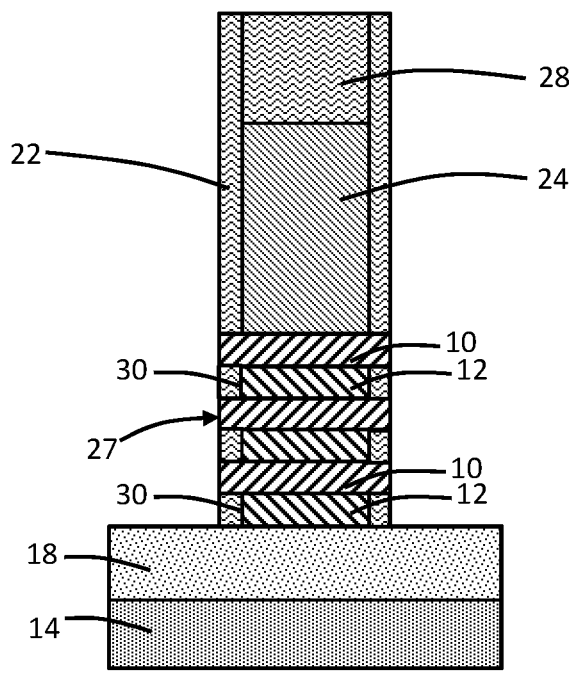
Figure 4:
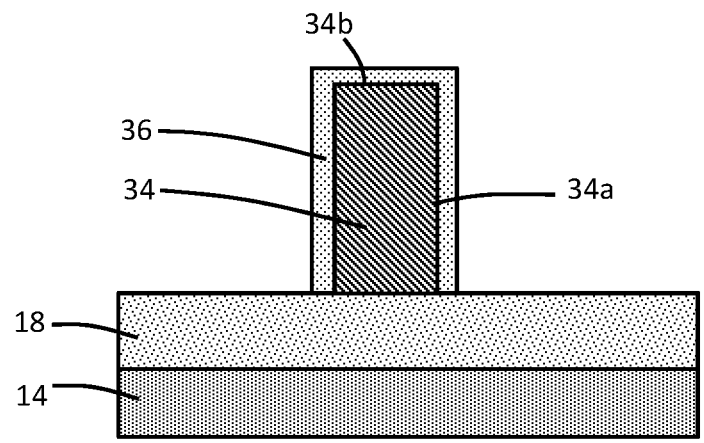
FIGS. 4, 4A, 4B, and 4C are cross-sectional views of the device structure at a fabrication stage of the processing method subsequent to FIGS. 3, 3A, 3B, and 3C.
Figure 4A:
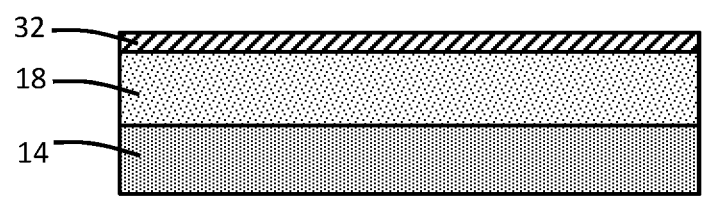
Figure 4B:
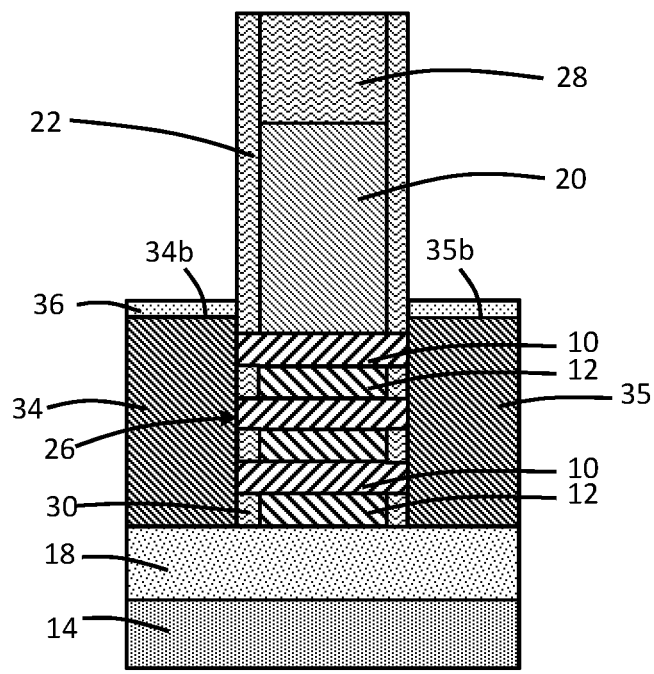
Figure 4C:
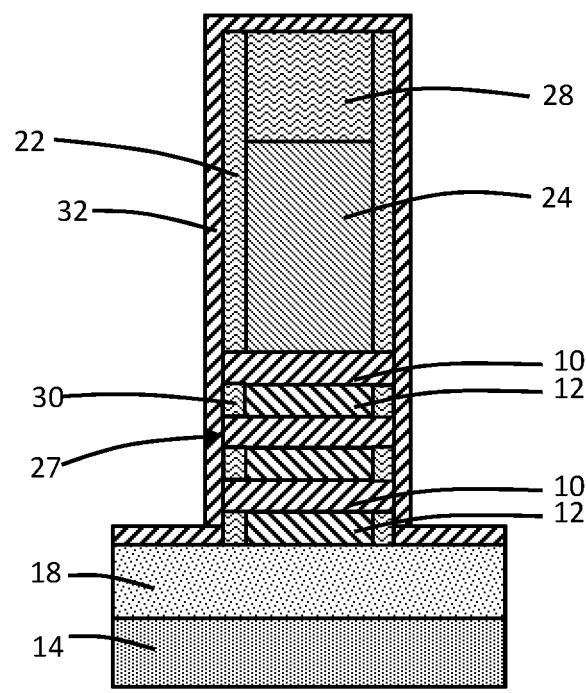
Figure 4D:
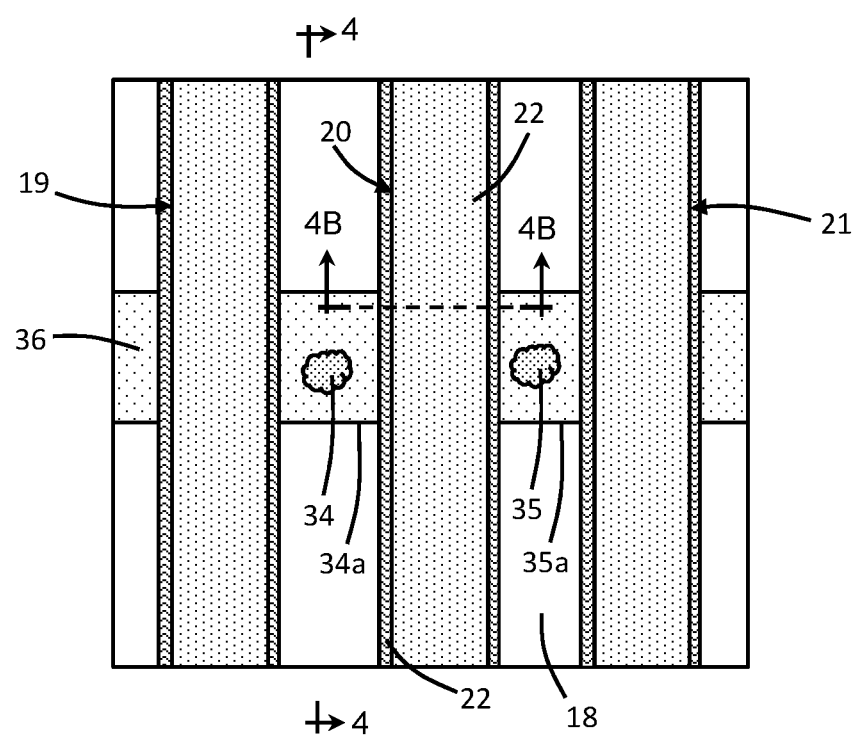

The layer stack 16 including the nanosheet channel layers 10 and sacrificial layers 12 may be used to form a nanosheet field-effect transistor of one conductivity type, such as a p-type nanosheet field-effect transistor. As shown in FIG. 2A, another layer stack 17 may be provided that includes a unique layered stack including the nanosheet channel layers 10 and the sacrificial layers 12. The layer stack 17 may be used to form a nanosheet field-effect transistor of an opposite conductivity type, such as an n-type nanosheet field-effect transistor.

A dielectric layer 18 composed of an oxide of silicon (e.g., silicon dioxide) may be arranged in the substrate 14 about and beneath the patterned layer stacks 16, 17 of nanosheet channel layers 10 and sacrificial layers 12. The dielectric layer 18 electrically isolates the layer stack 17 from the substrate 14, which reduces leakages and parasitic capacitance in a completed device structure during device operation. The dielectric layer 18 may be a buried oxide layer of a silicon-on-insulator substrate or a silicon-germanium-on-insulator substrate. Alternatively, the dielectric layer 18 may be arranged beneath each of the layer stacks 16, 17, and trench isolation regions may be arranged in the substrate 14 around the layer stacks 16 and the layer stacks 17. Alternatively, the dielectric layer 18 may be omitted from the device construction.

Sacrificial gate structures 19, 20, 21 are formed that overlap with and wrap around the patterned layer stack 16 of nanosheet channel layers 10 and sacrificial layers 12, and that are each aligned transverse to the patterned layer stack 16. The sacrificial gate structures 19, 20, 21 may include a thin oxide layer adjacent to the patterned layer stack 16 and a layer of sacrificial material, such as amorphous silicon, which are patterned with reactive ion etching (ME) using a hardmask. Each of the sacrificial gate structures 19, 20, 21 is covered by a hardmask cap 28. The hardmask caps 28 may be composed of, for example, silicon nitride ($Si_3N_4$), and may be a remnant of the hardmask from the lithography and etching process forming the sacrificial gate structures 19, 20, 21. The sacrificial gate structures 19, 20, 21 (FIG. 2B) may be used as part of a replacement metal gate process to form a nanosheet field-effect transistor of a given conductivity type, such as a p-type nanosheet field-effect transistor.

Figure 5:
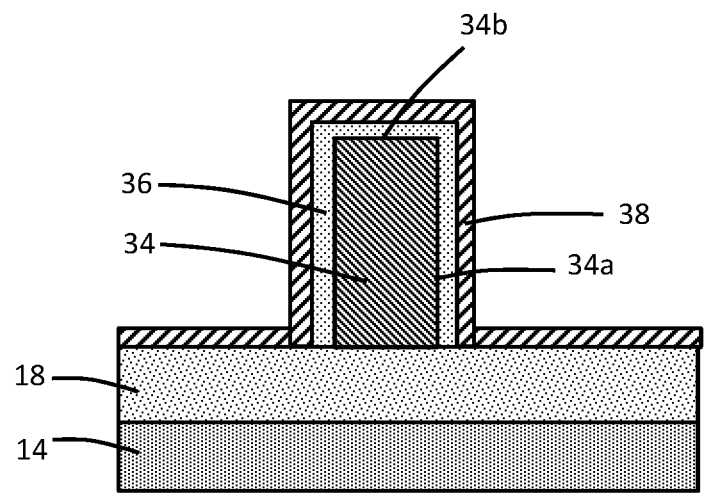
FIGS. 5, 5A, 5B, and 5C are cross-sectional views of the device structure at a fabrication stage of the processing method subsequent to FIGS. 4, 4A, 4B, and 4C.
Figure 5A:
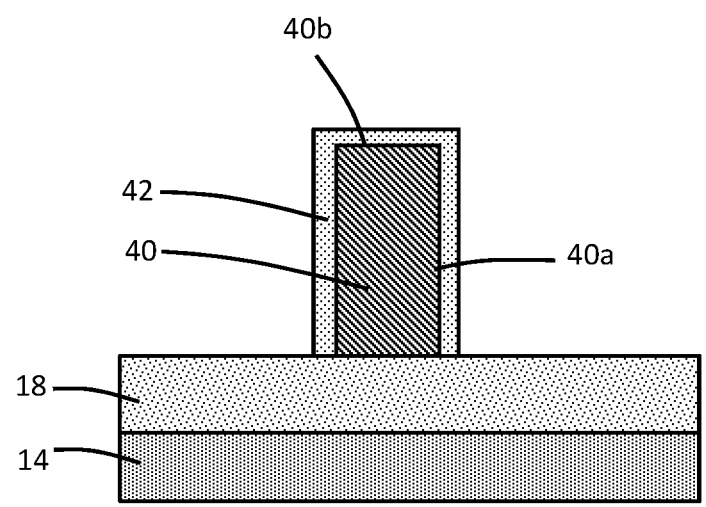
Figure 5B:
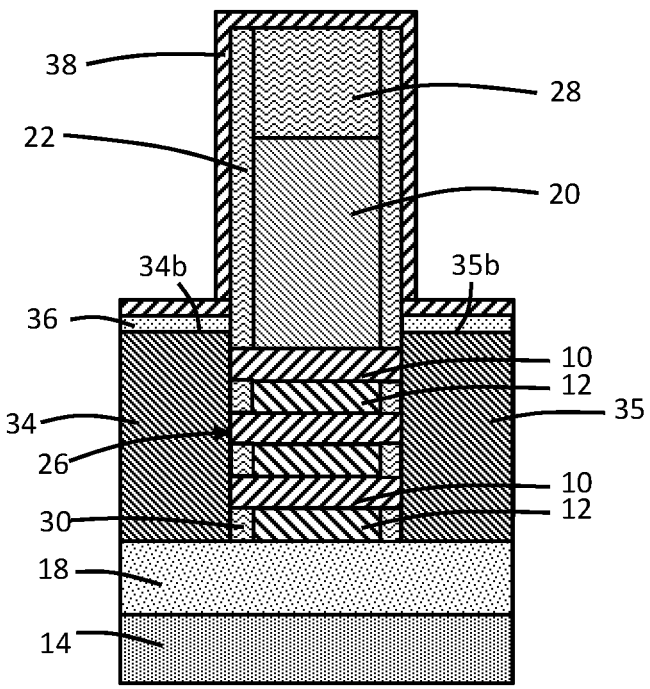
Figure 5C:
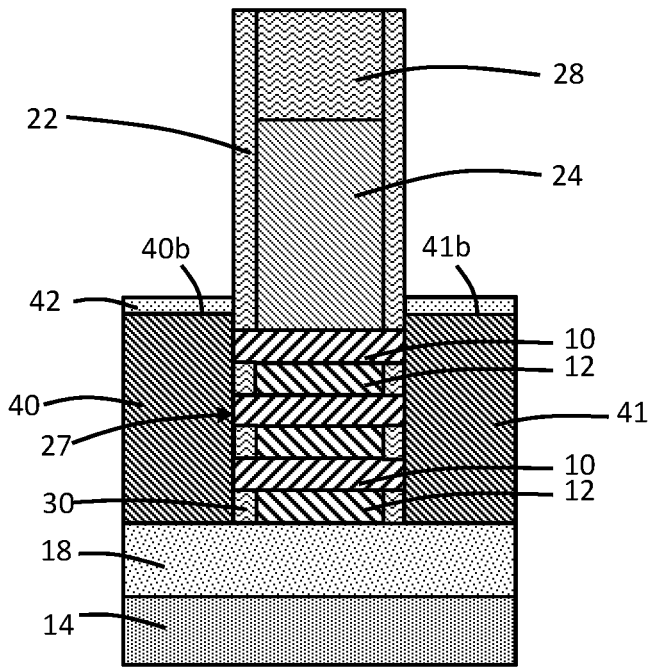
Figure 5D:
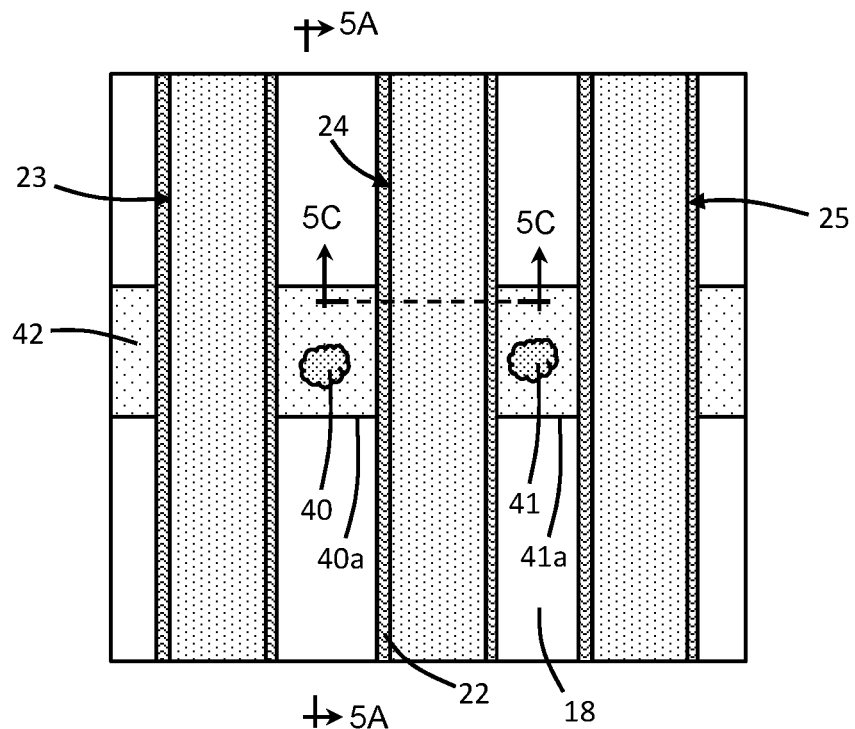

Additional sacrificial gate structures 23, 24, 25 (FIGS. 2C, 5D), which are similar to the sacrificial gate structures 19, 20, 21, are formed that extend across and wrap about the patterned layer stack 17 of nanosheet channel layers 10 and sacrificial layers 12. The sacrificial gate structures 23, 24, 25, which are also covered by hardmask caps 28, may be used to form a nanosheet field-effect transistor of an opposite conductivity type, such as an n-type nanosheet field-effect transistor.

With reference to FIGS. 3, 3A, 3B, 3C in which like reference numerals refer to like features in FIGS. 2, 2A, 2B, 2C and at a subsequent fabrication stage of the processing method, sidewall spacers 22 are formed adjacent to the sidewalls of each of the sacrificial gate structures 19, 20, 21 and sacrificial gate structures 23, 24, 25, as well as the associated hardmask caps 28. The sidewall spacers 22 may be composed of a dielectric material including, but not limited to, silicon nitride ($Si_3N_4$), SiBCN, SiOCN, SiOC, SiON, or SiC, that is deposited as a conformal layer by atomic layer deposition (ALD) and etched with an anisotropic etching process, such as reactive ion etching (RIE).

After forming the sidewall spacers 22, the layer stack 16 is patterned to form body features 26 that include the patterned nanosheet channel layers 10 and sacrificial layers 12, and the layer stack 17 is patterned to form respective body features 27 that also include the patterned nanosheet channel layers 10 and sacrificial layers 12. The layer stacks 16, 17 are patterned by a self-aligned etching process in which the sidewall spacers 22 and hardmask caps 28 on each of the sacrificial gate structures 19, 20, 21 effectively operate as an etch mask when forming the body features 26 and in which the sidewall spacers 22 and hardmask caps 28 on each of the sacrificial gate structures 23, 24, 25 operate as an etch mask when forming the body features 27. The self-aligned etching process, which may be a reactive ion etching (RIE) process, may utilize one or more etch chemistries to etch the layer stacks 16, 17. The etching process, which may remove the materials of the layer stacks 16, 17 selective to the material of the dielectric layer 18, completely removes the layer stacks 16, 17 from areas that are not masked.

After forming the body features 26, 27, the sacrificial layers 12 in each of the body features 26, 27 are laterally recessed relative to the nanosheet channel layers 10 with a dry or wet isotropic etching process that etches the semiconductor material constituting the sacrificial layers 12 selective to the semiconductor material constituting the nanosheet channel layers 10. The lateral recessing of the sacrificial layers 12 generates indents in the sidewalls of the body features 26, 27 because, at least in part, the nanosheet channel layers 10 are not laterally recessed due to the etch selectivity of the isotropic etching process.

Inner spacers 30 are subsequently formed in the indents in each of the body features 26, 27 and are arranged in the indents adjacent to the recessed ends of the sacrificial layers 12. The inner spacers 30 may be formed by depositing a conformal layer composed of a dielectric material, such as silicon nitride ($Si_3N_4$), by atomic layer deposition (ALD), that fills the indents by pinch-off, and then performing an etching process that removes the deposited conformal layer outside of the indents.

With reference to FIGS. 4, 4A, 4B, 4C, 4D in which like reference numerals refer to like features in FIGS. 3, 3A, 3B, 3C and at a subsequent fabrication stage of the processing method, a liner 32 composed of a dielectric material is deposited over the body features 27 and the sacrificial gate structures 23, 24, 25, as well as over the body features 26 and the sacrificial gate structures 19, 20, 21. For example, the liner 32 may be composed of a conformal layer of silicon nitride ($Si_3N_4$). The deposited liner 32 is patterned with a lithography and etching process to open the region used to form the p-type nanosheet field-effect transistor that includes the body features 26 and the sacrificial gate structures 19, 20, 21.

Epitaxial semiconductor layers 34, 35 are formed by an epitaxial growth process in which the semiconductor material grows from growth seeds provided by the exposed opposite side surfaces of the nanosheet channel layers 10 of each body feature 26. The inner spacers 30 physically isolate the epitaxial semiconductor layers 34, 35 from the sacrificial layers 12 of the body features 26, and prevent unwanted epitaxial growth from the sacrificial layers 12 of the body features 26. The body features 27 are covered by the liner 32, which prevents epitaxial growth from the nanosheet channel layers 10 of the body features 27. The dielectric layer 18, which does not support epitaxial growth of semiconductor material, is arranged in a vertical direction between the epitaxial semiconductor layers 34, 35 and the substrate 14.

The epitaxial semiconductor layers 34, 35 are raised relative to the dielectric layer 18 and the substrate 14, and the epitaxial semiconductor layer 34 and the epitaxial semiconductor layer 35 are directly connected with opposite end portions of the nanosheet channel layers 10. The epitaxial semiconductor layer 34 has exterior surfaces that include one or more side surfaces 34a and a top surface 34b, which may be planar as illustrated or non-planar. Similarly, the epitaxial semiconductor layer 35 has exterior surfaces that include one or more side surfaces 35a and a top surface 35b, which may be planar as illustrated or non-planar. In alternative embodiments, the epitaxial semiconductor layers 34, 35 may also have exterior surfaces arranged in a shape, such as a diamond shape or a merged diamond shape, that differs from the representative rectangular shape. In an embodiment, the epitaxial semiconductor layers 34, 35 may be composed of single-crystal silicon-germanium (SiGe) with a germanium content of forty percent (40%) to sixty percent (60%), and may be heavily doped to have p-type electrical conductivity. Specifically, the epitaxial semiconductor layers 34, 35 may be doped during epitaxial growth with a p-type dopant from Group III of the Periodic Table (e.g., boron (B), aluminum (Al), gallium (Ga), and/or indium (In)) that provides p-type electrical conductivity. As used herein, the term "source/drain region" means a doped region of semiconductor material that can function as either a source or a drain of a nanosheet field-effect transistor.

An epitaxial semiconductor layer 36 is formed by an epitaxial growth process in which the semiconductor material grows from, and covers, the one or more side surfaces 34a and top surface 34b bounding the exterior of the epitaxial semiconductor layer 34, and the one or more side surfaces 35a and top surface 35b bounding the exterior of the epitaxial semiconductor layer 35. The semiconductor material comprising the epitaxial semiconductor layer 36 is chosen to be removed selective to the semiconductor material comprising the epitaxial semiconductor layers 34, 35. In an embodiment in which the epitaxial semiconductor layers 34, 35 are composed of silicon-germanium, the epitaxial semiconductor layer 36 may be composed of single-crystal silicon. The epitaxial semiconductor layer 36 is sacrificial in that the epitaxial semiconductor layer 36 is removed in a subsequent fabrication stage and is therefore absent from the completed device structure formed using the body features 26. The dielectric layer 18 and liner 32 do not support epitaxial growth of the epitaxial semiconductor layer 36.

With reference to FIGS. 5, 5A, 5B, 5C, 5D in which like reference numerals refer to like features in FIGS. 4, 4A, 4B, 4C, 4D and at a subsequent fabrication stage of the processing method, the liner 32 is removed with an etching process, and a liner 38 composed of a dielectric material is deposited over the epitaxial semiconductor layer 36 covering the surfaces 34a, 34b of the epitaxial semiconductor layer 34 and the surfaces 35a, 35b of the epitaxial semiconductor layer 35, the body features 26, and the sacrificial gate structures 19, 20, 21, as well as over the body features 27 and sacrificial gate structures 23, 24, 25. For example, the liner 38 may be composed of a conformal layer of silicon nitride ($Si_3N_4$). The deposited liner 38 is patterned with a lithography and etching process to open the region used to form the n-type nanosheet field-effect transistor that includes the body features 27 and the sacrificial gate structures 23, 24, 25.

Epitaxial semiconductor layers 40, 41 are formed by an epitaxial growth process in which the semiconductor material grows from growth seeds provided by the exposed opposite side surfaces of the nanosheet channel layers 10 of the body features 27. The inner spacers 30 physically isolate the epitaxial semiconductor layers 40, 41 from the sacrificial layers 12 of the body features 27, and prevent unwanted epitaxial growth from the sacrificial layers 12 of the body features 27. The liner 38 prevents epitaxial growth from the epitaxial semiconductor layer 36 covering the epitaxial semiconductor layers 34, 35. The dielectric layer 18, which does not support epitaxial growth of the epitaxial semiconductor layers 40, 41, is arranged in a vertical direction between the epitaxial semiconductor layers 40, 41 and the substrate 14. The epitaxial semiconductor layer 40 and the epitaxial semiconductor layer 41 provide source/drain regions on opposite sides of each body feature 27 for the nanosheet field-effect transistor formed using the body features 27.

The epitaxial semiconductor layers 40, 41 are raised relative to the dielectric layer 18 and the substrate 14, and the epitaxial semiconductor layer 40 and the epitaxial semiconductor layer 41 are directly connected with opposite end portions of the nanosheet channel layers 10. The epitaxial semiconductor layer 40 has exterior surfaces that include one or more side surfaces 40a and a top surface 40b, which may be planar as illustrated or non-planar. Similarly, the epitaxial semiconductor layer 41 has exterior surfaces that include one or more side surfaces 41a and a top surface 41b, which may be planar as illustrated or non-planar. In alternative embodiments, the epitaxial semiconductor layers 40, 41 may also have exterior surfaces arranged in a shape, such as a diamond shape or a merged diamond shape, that differs from the representative rectangular shape. In an embodiment, the epitaxial semiconductor layers 40, 41 may be composed of single-crystal silicon (Si) and may be heavily doped to have n-type electrical conductivity. Specifically, the epitaxial semiconductor layers 40, 41 may be doped during epitaxial growth with an n-type dopant from Group V of the Periodic Table (e.g., phosphorus (P) and/or arsenic (As)) that provides n-type electrical conductivity.

An epitaxial semiconductor layer 42 is formed by an epitaxial growth process in which the semiconductor material grows from, and covers, the one or more side surfaces 40a and top surface 40b bounding the exterior of the epitaxial semiconductor layer 40 and the one or more side surfaces 41a and top surface 41b bounding the exterior of the epitaxial semiconductor layer 41. In an embodiment in which the epitaxial semiconductor layers 40, 41 are composed of single-crystal silicon, the epitaxial semiconductor layer 42 may be composed of single-crystal silicon-germanium with a germanium content of twenty percent (20%) to sixty percent (60%). The epitaxial semiconductor layer 42 is sacrificial in that the epitaxial semiconductor layer 42 is removed in a subsequent fabrication stage and is therefore absent from the completed device structure formed using the body features 27. The dielectric layer 18 and liner 38 do not support epitaxial growth of the layer 42.

With reference to FIGS. 6, 6A, 6B, 6C in which like reference numerals refer to like features in FIGS. 5, 5A, 5B, 5C and at a subsequent fabrication stage of the processing method, the liner 38 is removed with an etching process, and the epitaxial semiconductor layer 36 over the epitaxial semiconductor layers 34, 35 and the epitaxial semiconductor layer 42 over the epitaxial semiconductor layers 40, 41 are covered by a contact etch stop layer (CESL) 44. The CESL 44 may be constituted by a thin layer containing silicon nitride ($Si_3N_4$). An interlayer dielectric layer 46 is deposited and planarized by chemical mechanical polishing (CMP). The interlayer dielectric layer 46 may be composed of a dielectric material, such as silicon dioxide ($SiO_2$).

The hardmask caps 28 are exposed after planarization and may be removed to expose the sacrificial gate structures 19, 20, 21 and the sacrificial gate structures 23, 24, 25. Following their exposure, the sacrificial gate structures 19, 20, 21 and the sacrificial gate structures 23, 24, 25 may then be removed with an etching processes. The sacrificial layers 12 are subsequently removed selective to the nanosheet channel layers 10 and the inner spacers 30, which releases the nanosheet channel layers 10 and opens spaces surrounding the nanosheet channel layers 10 of each of the body features 26, 27.

Functional gate structures 50 are formed in the spaces surrounding the nanosheet channel layers 10 of the body features 26 and functional gate structures 52 are formed in the spaces surrounding each of the nanosheet channel layers 10 of the body features 27 as part of a replacement gate process to form multiple-gate nanosheet field-effect transistors. These sections of the functional gate structures 50, 52 surround respective exterior surfaces of the nanosheet channel layers 10 of the different body features 26, 27 in a gate-all-around arrangement. The functional gate structures 50, 52 may include a gate dielectric layer composed of a dielectric material, such as a high-k dielectric like hafnium oxide ($HfO_2$), and a metal gate electrode. The gate dielectric layer is arranged between the metal gate electrode and the exterior surfaces of the nanosheet channel layers 10. The metal gate electrode includes one or more conformal barrier metal layers and/or work function metal layers, such as layers composed of titanium aluminum carbide (TiAlC) and/or titanium nitride (TiN), and a metal gate fill layer composed of a conductor, such as tungsten (W). The functional gate structures 50, 52 may include different combinations of the work function metal layers depending on the conductivity type of nanosheet field-effect transistor being formed. Self-aligned contact (SAC) caps 53 composed of a dielectric material, such as silicon nitride, are formed in the spaces between the sidewall spacers 22 over each of the functional gate structures 50, 52.

A p-type nanosheet field-effect transistor 48 includes the functional gate structures 50 and the source/drain regions provided by the epitaxial semiconductor layers 34, 35. The inner spacers 30 are arranged between the sections of the functional gate structures 50 and the epitaxial semiconductor layers 35, 36 providing the source/drain regions of the p-type nanosheet field-effect transistor 48.

An n-type nanosheet field-effect transistor 49 includes the functional gate structures 52 and the source/drain regions provided by the epitaxial semiconductor layers 40, 41. The inner spacers 30 are also arranged between the sections of the functional gate structures 52 and the epitaxial semiconductor layers 41, 42 providing the source/drain regions of the n-type nanosheet field-effect transistor 49.

Figure 6:
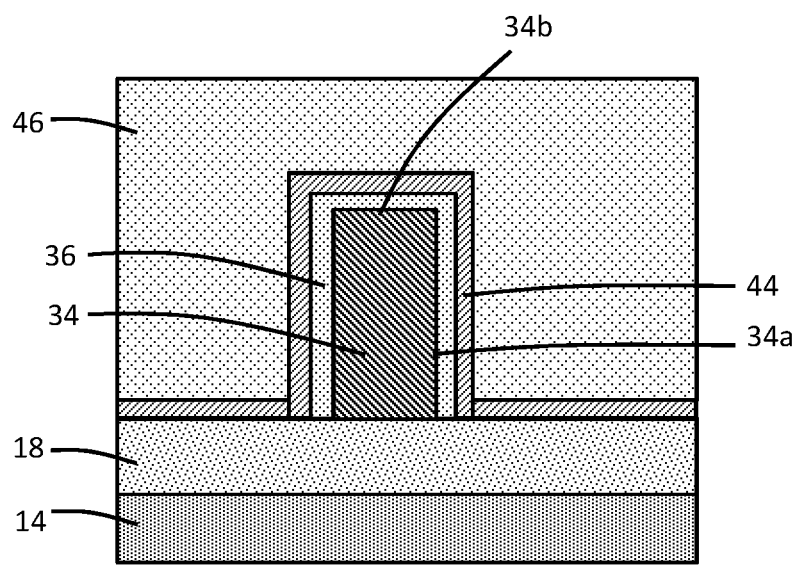
FIGS. 6, 6A, 6B, and 6C are cross-sectional views of the device structure at a fabrication stage of the processing method subsequent to FIGS. 5, 5A, 5B, and 5C.
Figure 6A:
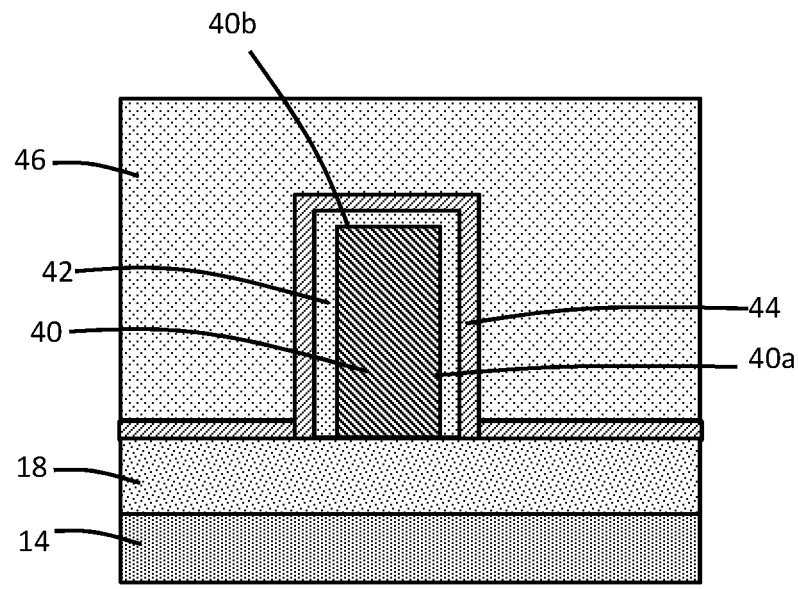
Figure 6B:
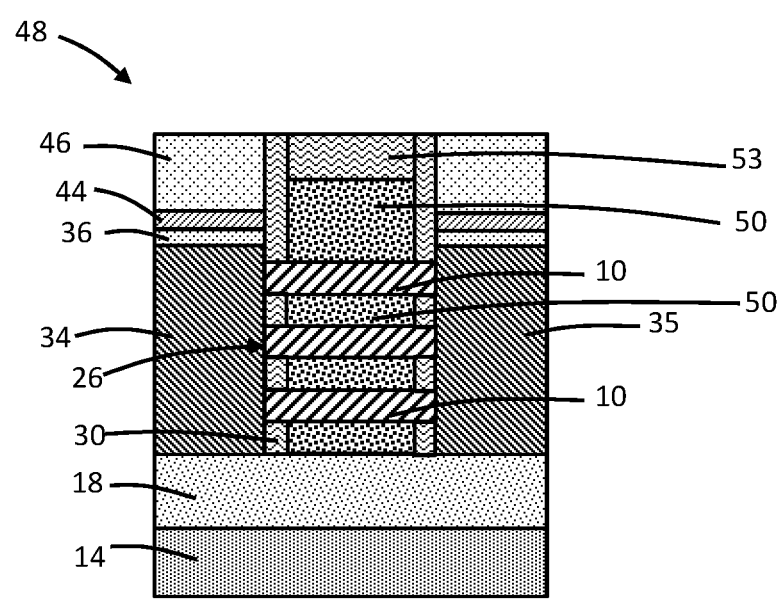
Figure 6C:
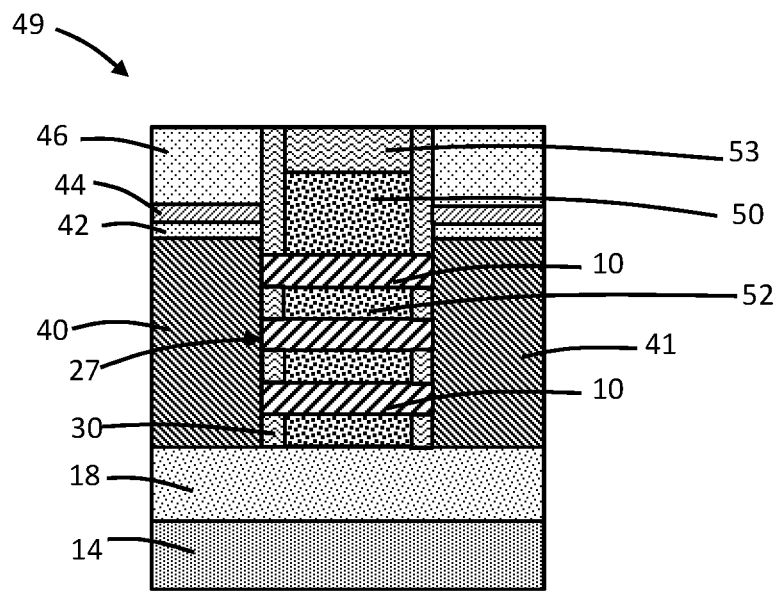
Figure 7:
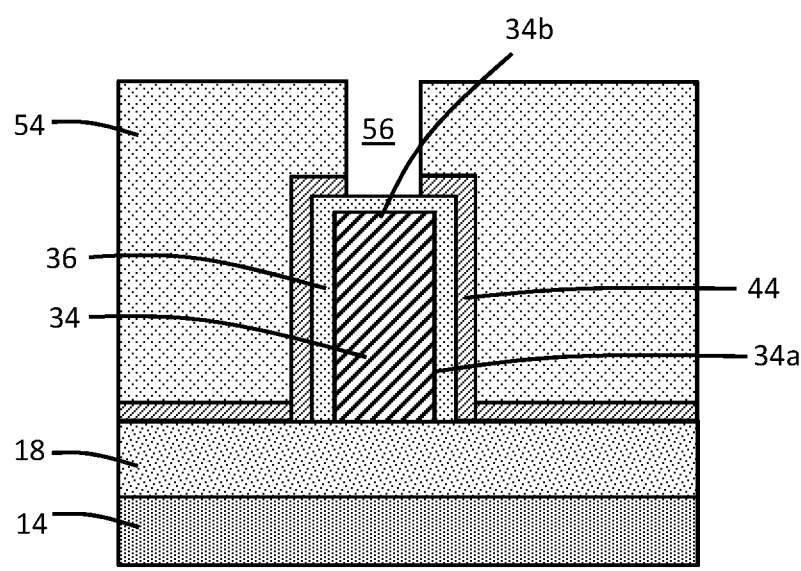
FIGS. 7, 7A are cross-sectional views of the device structure at a fabrication stage of the processing method subsequent to FIGS. 6, 6A.
Figure 7A:
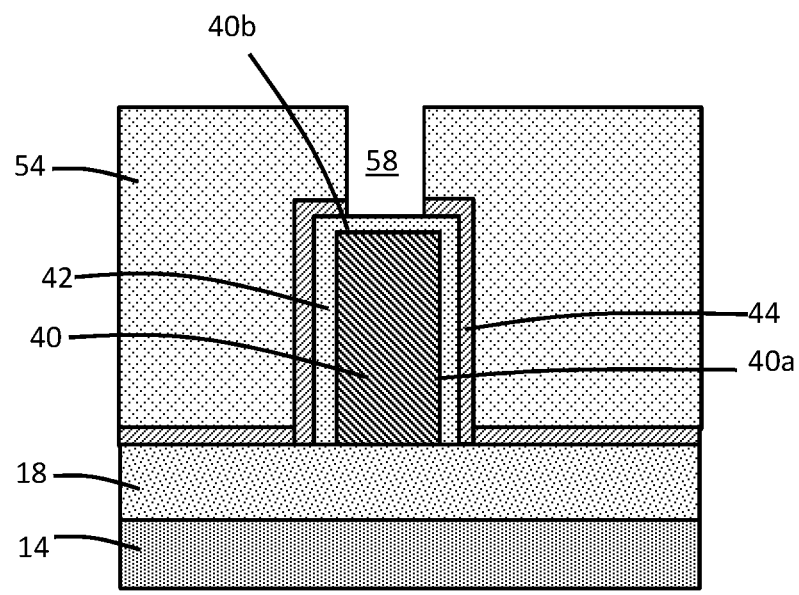

With reference to FIGS. 7, 7A in which like reference numerals refer to like features in FIGS. 6, 6A and at a subsequent fabrication stage of the processing method, a patterned etch mask (not shown) is formed by lithography over the interlayer dielectric layer 54 and an etching process is used to form openings 56, 58 extending through the interlayer dielectric layer 46 and the CESL 44. The etching process may be a reactive ion etching (ME) process. One of the openings 56 extends to the sacrificial epitaxial semiconductor layer 36 over the top surface 34b of the epitaxial semiconductor layer 34 providing one of the source/drain regions for the p-type nanosheet field-effect transistor 48. Although not shown, the other of the openings 56 extends to the sacrificial epitaxial semiconductor layer 36 over the top surface 35b of the epitaxial semiconductor layer 35 providing the other of the source/drain regions for the p-type nanosheet field-effect transistor 48. One of the openings 58 extends to the sacrificial epitaxial semiconductor layer 42 over the top surface 40b of the epitaxial semiconductor layer 40 providing one of the source/drain regions for the n-type nanosheet field-effect transistor 49. Although not shown, the other of the openings 58 extends to the sacrificial epitaxial semiconductor layer 42 over the top surface 41b of the epitaxial semiconductor layer 41 providing the other of the source/drain regions for the n-type nanosheet field-effect transistor 49.

Figure 8:
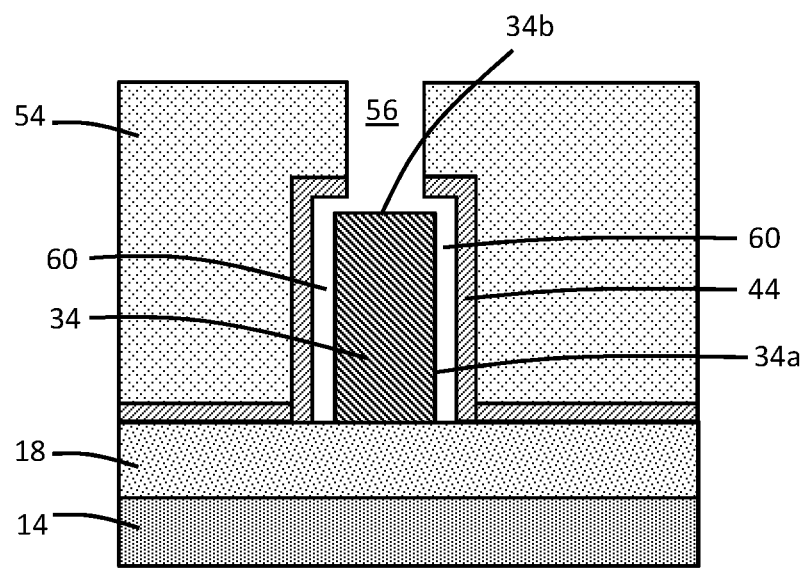
FIGS. 8, 8A are cross-sectional views of the device structure at a fabrication stage of the processing method subsequent to FIGS. 7, 7A.
Figure 8A:
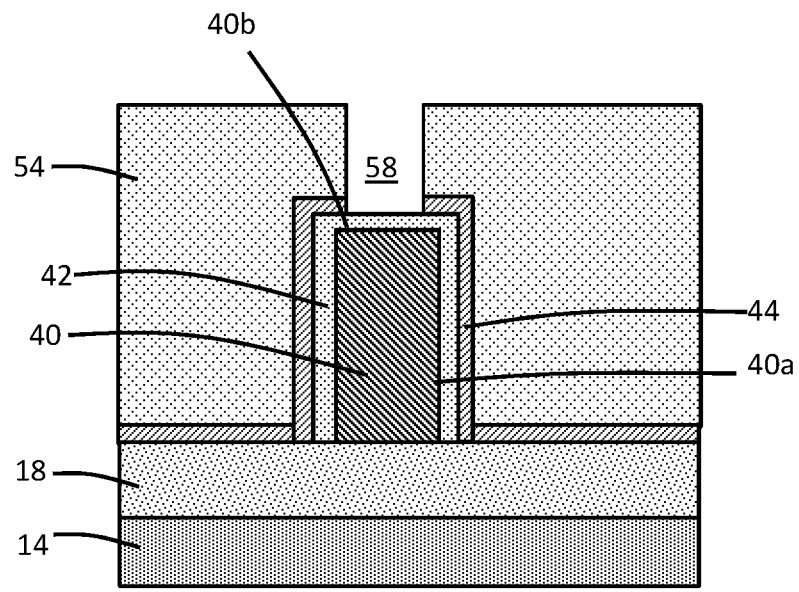

With reference to FIGS. 8, 8A in which like reference numerals refer to like features in FIGS. 7, 7A and at a subsequent fabrication stage of the processing method, the sacrificial epitaxial semiconductor layer 36 is removed with an isotropic etching process that etches the semiconductor material constituting the layer 36 selective to the semiconductor materials constituting the epitaxial semiconductor layers 34, 35 and the sacrificial epitaxial semiconductor layer 42, as well as the material of the CESL 44. Access for exposing the sacrificial epitaxial semiconductor layer 36 to the selective etching process is provided through the openings 56. In an embodiment, the selective etching process may be a wet chemical etching process that is isotropic. In an embodiment, the wet chemical etching process may utilize a basic solution containing a base substance, such as, for example, ammonium hydroxide ($NH_4OH$) or tetraethyl-ammonium hydroxide (TEAH).

The removal of the sacrificial epitaxial semiconductor layer 36, which may constitute a complete removal, forms cavities 60 inside each of the spaces formerly occupied by the sacrificial epitaxial semiconductor layer 36. Each of the cavities 60 defines a confined space that surrounds or wraps about one of the epitaxial semiconductor layers 34, 35 providing the source/drain regions of the p-type nanosheet field-effect transistor 48. The confined spaces formed by the cavities 60 are enclosed or surrounded by the epitaxial semiconductor layers 34, 35 and the CESL 44. One of the cavities 60 surrounds or wraps about the epitaxial semiconductor layer 34 providing one of the source/drain regions of the p-type nanosheet field-effect transistor 48 and is arranged primarily between the epitaxial semiconductor layer 40 and the inwardly-facing surface of the CESL 44 to provide the confinement. Although not shown, another cavity 60 surrounds or wraps about the epitaxial semiconductor layer 35 providing the other of the source/drain regions of the p-type nanosheet field-effect transistor 48 and is arranged primarily between the epitaxial semiconductor layer 35 and the inwardly-facing surface of the CESL 44.

The sacrificial epitaxial semiconductor layer 42 is also exposed to the selective etching process through the openings 58. The sacrificial epitaxial semiconductor layer 42 and the epitaxial semiconductor layers 34, 35 are not etched by the selective etching process because of the compositional difference arising from their respective germanium contents in comparison with the sacrificial epitaxial semiconductor layer 36 having a composition that is free of germanium. During the selective etching process, the sacrificial epitaxial semiconductor layer 42 masks and protects the epitaxial semiconductor layers 40, 41, which lack etch selectivity to the selective etching process.

Figure 9:
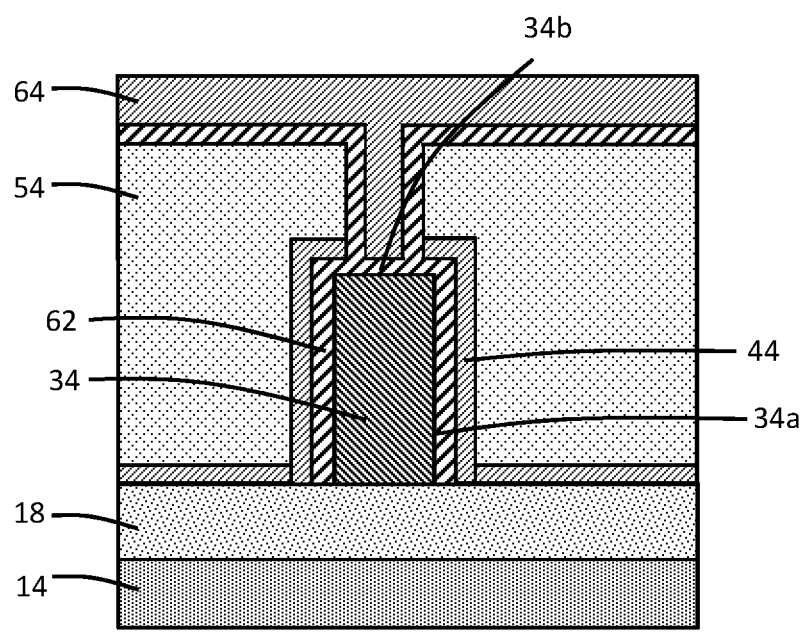
FIGS. 9, 9A are cross-sectional views of the device structure at a fabrication stage of the processing method subsequent to FIGS. 8, 8A.
Figure 9A:
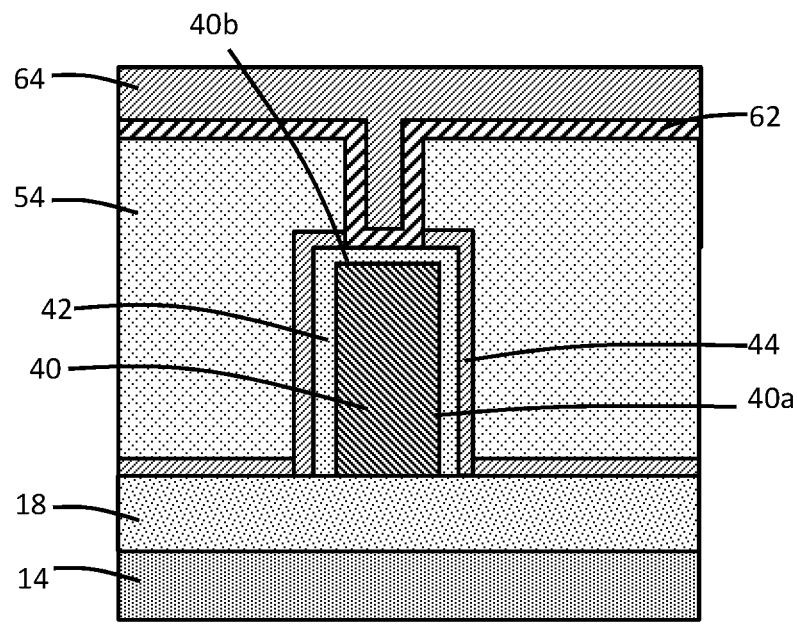

With reference to FIGS. 9, 9A in which like reference numerals refer to like features in FIGS. 8, 8A and at a subsequent fabrication stage of the processing method, a silicide layer 62 may be formed inside the cavities 60 on the surfaces 34a, 34b of the epitaxial semiconductor layer 34 and the inwardly-facing surface of the CESL 44 bordering the cavity 60, as well as on the surfaces 35a, 35b of the epitaxial semiconductor layer 35 and the inwardly-facing surface of the CESL 44 bordering the other cavity 60. The silicide layer 62 is wrapped about the exterior of the epitaxial semiconductor layer 34 in that the one or more side surfaces 34a and the top surface 34b are in direct contact with the silicide layer 62. The silicide layer 62 is also wrapped about the epitaxial semiconductor layer 35 in that the one or more side surfaces 35a and the top surface 35b are in direct contact with the silicide layer 62. The silicide layer 62 is arranged between the epitaxial semiconductor layers 34, 35, and the CESL 44, which surrounds each of the epitaxial semiconductor layers 34, 35, is also in direct contact with the silicide layer 62.

The silicide layer 62 may be formed by, for example, chemical vapor deposition (CVD) or atomic layer deposition (ALD) using a precursor reactant containing one or more targeted metals. In an embodiment, the metal contained in the silicide layer 62 may be nickel (Ni), and the silicide layer 62 may be nickel silicide. In an embodiment, the metals contained in the silicide layer 62 may be nickel (Ni) and platinum (Pt), and the silicide layer 62 may be nickel-platinum silicide. In an embodiment, the metal contained in the silicide layer 62 is selected to be compatible with the formation of the p-type nanosheet field-effect transistor 48 and may, for example, minimize contact resistance.

The silicide layer 62 also deposits inside of the openings 56, 58, and on the top surface of the interlayer dielectric layer 54. The filling of the openings 56, 58 by the silicide layer 62 may be only partial, in which instance a metal fill layer 64, which may be composed of tungsten (W) or titanium nitride (TiN), may be deposited to finish the filling of the openings 56, 58 and close them.

Figure 10:
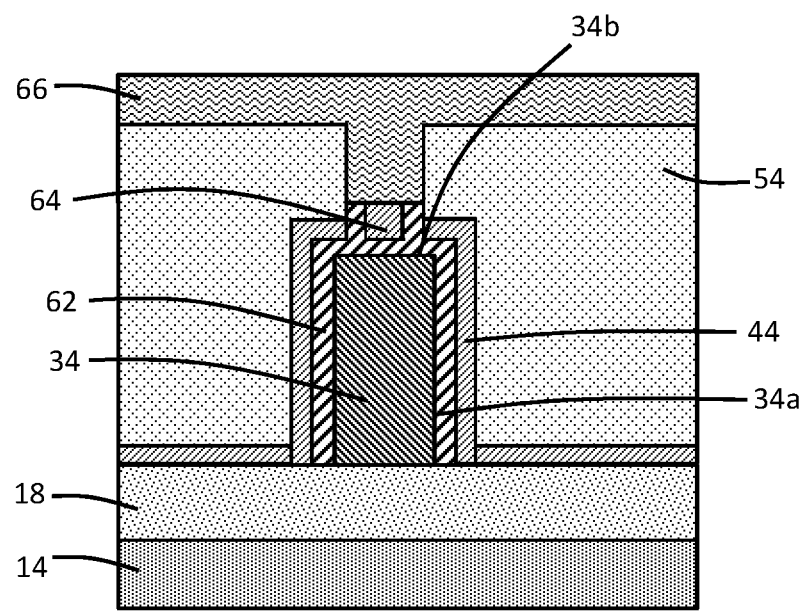
FIGS. 10, 10A are cross-sectional views of the device structure at a fabrication stage of the processing method subsequent to FIGS. 9, 9A.
Figure 10A:
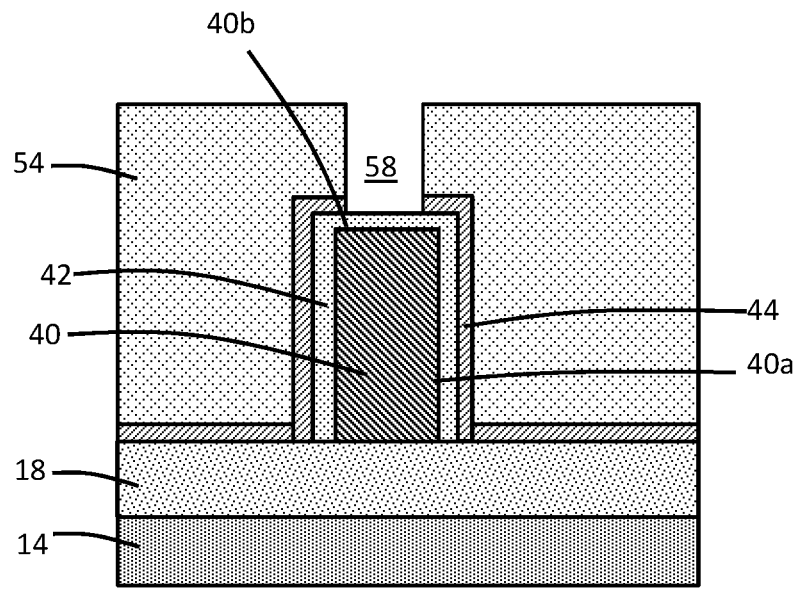

With reference to FIGS. 10, 10A in which like reference numerals refer to like features in FIGS. 9, 9A and at a subsequent fabrication stage of the processing method, the silicide layer 62 and metal fill layer 64 may be recessed inside the openings 56, 58 and removed from the interlayer dielectric layer 54 with an etching process. Following the etching process, a spin-on hardmask 66 is applied and patterned using lithography and etching to provide an etch mask that covers the recessed silicide layer 62 and metal fill layer 64 inside the openings 56. The spin-on hardmask 66 may include an organic planarization layer (OPL) material. After the spin-on hardmask 66 is formed, the recessed silicide layer 62 and metal fill layer 64 are removed from the openings 58 using an etching process. A portion of the metal fill layer 64 remains inside the openings 56 and is partially surrounded by the silicide layer 62.

Figure 11:
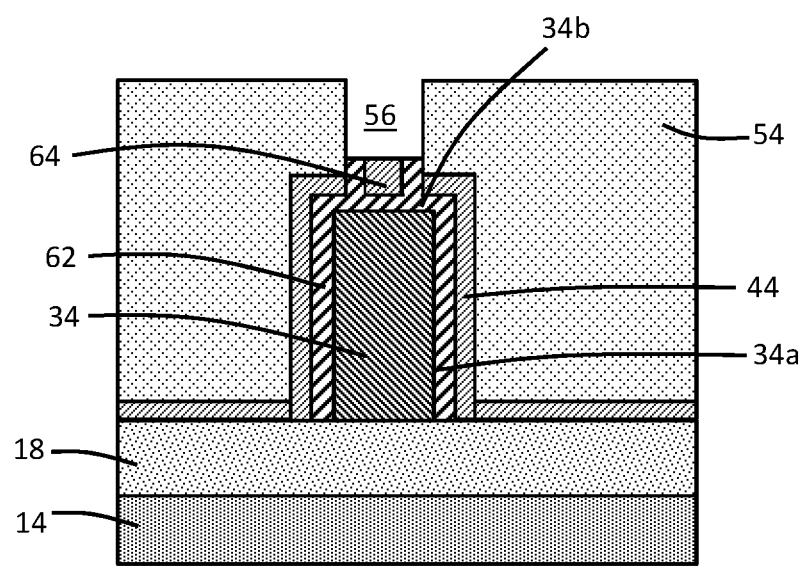
FIGS. 11, 11A are cross-sectional views of the device structure at a fabrication stage of the processing method subsequent to FIGS. 10, 10A.
Figure 11A:
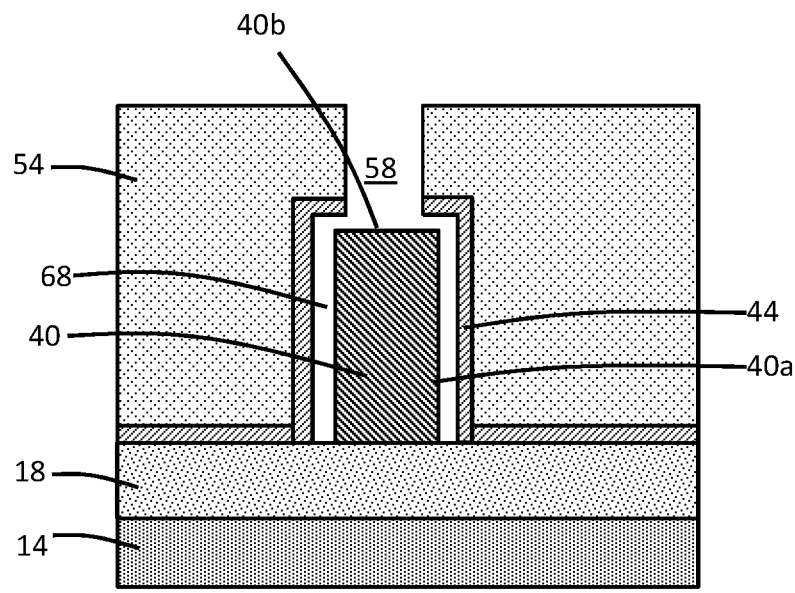

With reference to FIGS. 11, 11A in which like reference numerals refer to like features in FIGS. 10, 10A and at a subsequent fabrication stage of the processing method, the spin-on hardmask 66 is removed by ashing with a plasma, followed by removing the sacrificial epitaxial semiconductor layer 42 with an isotropic etching process that etches the semiconductor material constituting the layer 42 selective to the semiconductor materials constituting the epitaxial semiconductor layers 40, 41. Access for removing the sacrificial epitaxial semiconductor layer 42 is provided through the openings 58. In an embodiment, the selective etching process may utilize a vapor containing hydrochloric acid (HCl) that isotropically etches the sacrificial epitaxial semiconductor layer 42.

The removal of the sacrificial epitaxial semiconductor layer 42, which may constitute a complete removal, forms a cavity 68 inside each of the spaces formerly occupied by the sacrificial epitaxial semiconductor layer 42. Each of the cavities 68 defines a confined space that surrounds or wraps about one of the epitaxial semiconductor layers 40, 41 providing the source/drain regions of the p-type nanosheet field-effect transistor 49. The confined spaces formed by the cavities 68 are enclosed or surrounded by the epitaxial semiconductor layers 40, 41 and the CESL 44. One of the cavities 68 surrounds or wraps about the epitaxial semiconductor layer 40 providing one of the source/drain regions of the n-type nanosheet field-effect transistor 49 and is arranged primarily between the epitaxial semiconductor layer 40 and the inwardly-facing surface of the CESL 44 to provide the confinement. Although not shown, another cavity 68 surrounds or wraps about the epitaxial semiconductor layer 41 providing the other of the source/drain regions of the n-type nanosheet field-effect transistor 49 and is arranged primarily between the epitaxial semiconductor layer 41 and the inwardly-facing surface of the CESL 44. The epitaxial semiconductor layers 40, 41 are not etched because of the compositional difference arising from the absence of a germanium content and/or their doping in comparison with the sacrificial epitaxial semiconductor layer 42 having a composition that contains germanium. The recessed silicide layer 62 and metal fill layer 64 occlude the openings 56 during the etching process.

Figure 12:
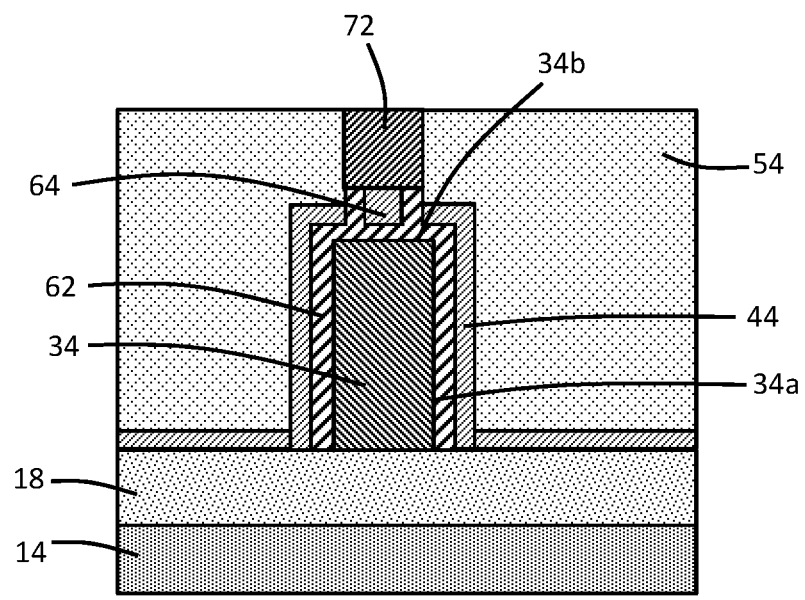
FIGS. 12, 12A are cross-sectional views of the device structure at a fabrication stage of the processing method subsequent to FIGS. 11, 11A.
Figure 12A:
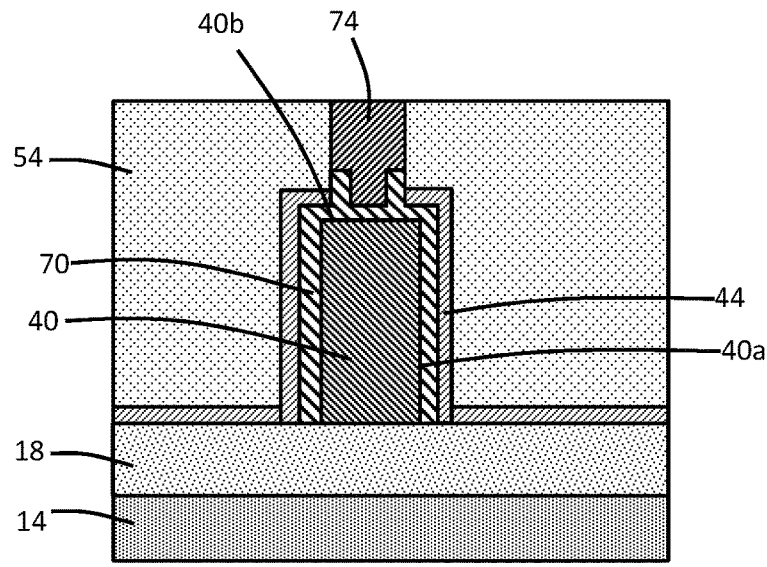

With reference to FIGS. 12, 12A in which like reference numerals refer to like features in FIGS. 11, 11A and at a subsequent fabrication stage of the processing method, a silicide layer 70 may be formed inside one of the cavities 68 on the inwardly-facing surface of the CESL 44 and the surfaces 40a, 40b of the epitaxial semiconductor layer 40, as well as inside the other cavity 68 on the surface of the CESL 44 and the surfaces 41a, 41b of the epitaxial semiconductor layer 41. The silicide layer 70 is wrapped about the epitaxial semiconductor layer 40 in that the one or more side surfaces 40a and the top surface 40b are in direct contact with the silicide layer 70. The silicide layer 70 is also wrapped about the epitaxial semiconductor layer 40 in that the one or more side surfaces 41a and the top surface 41b are in direct contact with the silicide layer 70. The silicide layer 70 is arranged between the epitaxial semiconductor layers 40, 41, and the CESL 44, which surrounds each of the epitaxial semiconductor layers 40, 41, is also in direct contact with the silicide layer 70.

The silicide layer 70 may be formed by, for example, chemical vapor deposition (CVD) or atomic layer deposition (ALD) using a precursor reactant containing one or more targeted metals. In an embodiment, the metal contained in the silicide layer 70 may be titanium (Ti) and the silicide layer 70 may be titanium silicide. In an embodiment, the metal contained in the silicide layer 70 is selected to be compatible with the formation of the n-type nanosheet field-effect transistor 49 and may, for example, minimize contact resistance. The silicide layer 70 may be chamfered using an etch mask formed inside the opening 58 and concurrently removed from opening 56. The silicide layer 70 may also deposit on the top surface of the interlayer dielectric layer 54 and may be removed during chamfering.

Portions 72, 74 of a metallization layer may be formed inside the remaining space inside the openings 56, 58. In an embodiment, the portions 72, 74 of the metallization layer may be deposited by chemical vapor deposition (CVD) and reflowed to fill the openings 56, 58. The composition of the portions 72, 74 of the metallization layer differs from the composition of either of the silicide layers 62, 70 and from the composition of the metal fill layer 64. In an embodiment, the portions 72, 74 of the metallization layer may be composed of a conductor, such as cobalt (Co) or ruthenium (Ru).

The silicide layer 62 and portion 72 of the metallization layer as well as the metal fill layer 64, contribute as components to collectively form a wrap-around contact in which the silicide layer 62 is wrapped about each of the epitaxial semiconductor layers 34, 35 providing the source/drain regions of the p-type nanosheet field-effect transistor 48. The silicide layer 62 provides a lower portion of each wrap-around contact, and the portion 72 of the metallization layer and the metal fill layer 64 collectively provide an upper portion of each wrap-around contact. The remaining portion of the recessed metal fill layer 64 is arranged, in a vertical direction, between the silicide layer 62 and the portion 72 of the metallization layer, which encapsulate this remaining portion of the recessed metal fill layer 64.

The silicide layer 70 and the portion 74 of the metallization layer contribute as components to collectively form a wrap-around contact in which the silicide layer 70 is wrapped about each of the epitaxial semiconductor layers 40, 41 providing the source/drain regions of the n-type nanosheet field-effect transistor 49. The silicide layer 70 provides a lower portion of each wrap-around contact, and the portion 74 of the metallization layer provides an upper portion of the wrap-around contact.

The silicide layer 62 and the silicide layer 70 are formed independent of each other and by sequential fabrication stages of the processing method. As a result, the composition of the silicide layer 62 can be selected independently of the composition of the silicide layer 70. Furthermore, the silicide layer 62, which is formed before silicide layer 70 in the representative embodiment, does not have to be removed from the space about the epitaxial semiconductor layer 40 before forming the silicide layer 70.

The representative embodiments of the invention are illustrated using n-type and p-type nanosheet field-effect transistors. In an alternative embodiment, the silicide layers 62, 70 may be formed as part of a processing method forming n-type and p-type fin-type field-effect transistors in which the body features 26, 27 are replaced by semiconductor fins. In an alternative embodiment, the silicide layers 62, 70 may be formed as part of a processing method forming n-type and p-type planar field-effect transistors that does not involve either the body features 26, 27 or fins.

Figure 13:
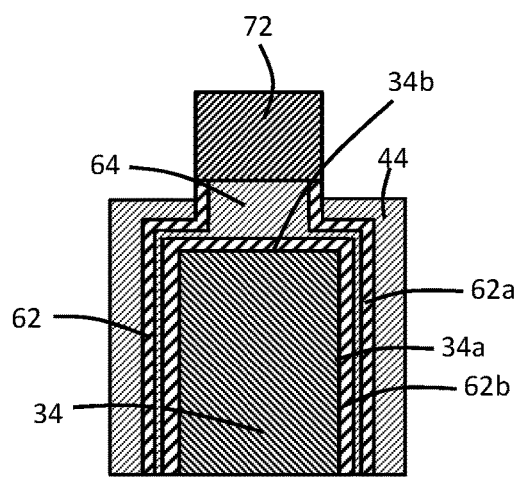
FIGS. 13, 13A are cross-sectional views similar to respective portions of FIGS. 12, 12A, but enlarged for purposes of illustration, of a device structure fabricated by a processing method in accordance with alternative embodiments of the invention.

With reference to FIG. 13 in which like reference numerals refer to like features in FIG. 12 and in accordance with alternative embodiments, the filling of the cavities 60 by the silicide layer 62 may be partial instead of complete as illustrated in FIG. 12. The partial filling of the cavities 60 may be enabled through selection of the thickness of the sacrificial epitaxial semiconductor layer 36 and/or through selection of the deposition parameters for the silicide layer 62 to avoid pinch-off inside the cavities 60. If partially filled, the surface of the CESL 44 bordering the cavities 60 may be covered by a section 62a of the silicide layer 62, the surfaces 34a, 34b of the epitaxial semiconductor layer 34 bordering one of the cavities 60 may be covered by a section 62b of the silicide layer 62, and the surfaces 35a, 35b of the epitaxial semiconductor layer 35 bordering the other cavity 60 may be covered by another section of the silicide layer 62. Because the cavities 60 are not closed, a section of the metal fill layer 64 will fill the open central portion of each cavity 60 between the section 62a of the silicide layer 62 and the section 62b of the silicide layer 62.

Figure 13A:
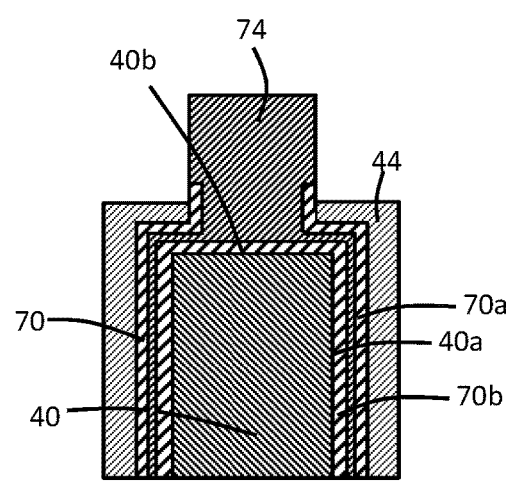

With reference to FIG. 13A in which like reference numerals refer to like features in FIG. 12A and in accordance with alternative embodiments, the filling of the cavities 68 by the silicide layer 70 may be partial instead of complete as illustrated in FIG. 12A. The partial filling of the cavities 68 may be enabled through selection of the thickness of the sacrificial epitaxial semiconductor layer 42 and/or through selection of the deposition parameters for the silicide layer 70 to avoid pinch-off inside the cavities 68. If partially filled, the surface of the CESL 44 bordering the cavities 68 may be covered by a section 70a of the silicide layer 70, the surfaces 40a, 40b of the epitaxial semiconductor layer 40 bordering one of the cavities 68 may be covered by a section 70b of the silicide layer 70, and the surfaces 41a, 41b of the epitaxial semiconductor layer 41 bordering the other cavity 68 may be covered by another section of the silicide layer 70. Because the cavities 68 are not closed, a section of the material used to form the metallization layer 74 will fill the open central portion of each cavity 68 between the section 70a of the silicide layer 70 and the section 70b of the silicide layer 70.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    epitaxially growing a first source/drain region of a first field-effect transistor;
    epitaxially growing a second source/drain region of a second field-effect transistor;
    epitaxially growing a first epitaxial semiconductor layer arranged to wrap around the first source/drain region;
    epitaxially growing a second epitaxial semiconductor layer arranged to wrap around the second source/drain region;
    forming an interlayer dielectric layer over the first source/drain region and the second source/drain region;
    forming a first opening extending through the interlayer dielectric layer to the first epitaxial semiconductor layer and a second opening extending through the interlayer dielectric layer to the second epitaxial semiconductor layer;
    removing the first epitaxial semiconductor layer selective to the second epitaxial semiconductor layer and the first source/drain region with a first selective etching process;
    after removing the first epitaxial semiconductor layer, forming a first silicide layer arranged to wrap around the first source/drain region;
    removing the second epitaxial semiconductor layer selective to the second source/drain region with a second selective etching process; and
    after removing the second epitaxial semiconductor layer, forming a second silicide layer arranged to wrap around the second source/drain region,
    wherein the first opening provides access to the first epitaxial semiconductor layer, the second opening provides access to the second epitaxial semiconductor layer, the first epitaxial semiconductor layer has a first composition, the second epitaxial semiconductor layer has a second composition different from the first composition, the first silicide layer comprises a first metal, and the second silicide layer comprises a second metal different from the first metal.

2. The method of claim 1 wherein the first source/drain region is epitaxially grown by a first epitaxial growth process, and the second source/drain region is epitaxially grown by a second epitaxial growth process after the first source/drain region is epitaxially grown.

3. The method of claim 1 wherein the first epitaxial semiconductor layer is epitaxially grown on the first source/drain region before the second epitaxial semiconductor layer is epitaxially grown on the second source/drain region.

4. The method of claim 1 wherein the second epitaxial semiconductor layer is removed after removing the first epitaxial semiconductor layer and after forming the first silicide layer.

5. The method of claim 1 wherein the first silicide layer is formed in the first opening and the second opening in the interlayer dielectric layer.

6. The method of claim 5 further comprising:
before removing the second epitaxial semiconductor layer, removing the first silicide layer from the second opening in the interlayer dielectric layer.

7. The method of claim 1 wherein the first silicide layer is formed with a deposition process in a confined space surrounding one or more sidewalls and a top surface of the first source/drain region, and the confined space is formed by removing the first epitaxial semiconductor layer.

8. The method of claim 7 wherein the first silicide layer is conformally formed with the deposition process in a first portion of the confined space, and the method further comprises:
depositing a metal fill layer having a first portion in the first opening and a second portion in a second portion of the confined space,
wherein the first silicide layer is arranged between the metal fill layer and the first source/drain region.

9. The method of claim 1 wherein the second silicide layer is formed with a deposition process in a confined space surrounding one or more sidewalls and a top surface of the first source/drain region, and the confined space is formed by removing the second epitaxial semiconductor layer.

10. The method of claim 9 wherein the second silicide layer is conformally formed with the deposition process in a first portion of the confined space, and the method further comprises:
depositing a metallization layer having a first portion in the second opening in the interlayer dielectric layer and a second portion in a second portion of the confined space,
wherein the second silicide layer is arranged between the second portion of the metallization layer and the second source/drain region.

11. The method of claim 1 wherein the first source/drain region has one or more side surfaces and a top surface, and the first silicide layer is formed in direct contact with the one or more side surfaces and the top surface of the first source/drain region.

12. The method of claim 11 further comprising:
forming a conformal dielectric layer on the first epitaxial semiconductor layer,
wherein the conformal dielectric layer is arranged to wrap about the one or more side surfaces and the top surface of the first epitaxial semiconductor layer, the first epitaxial semiconductor layer is removed by the first selective etching process selective to the conformal dielectric layer to form a confined space between the conformal dielectric layer and the first source/drain region, and the first silicide layer is formed in the confined space after removing the first epitaxial semiconductor layer.

13. The method of claim 1 further comprising:
exposing the first epitaxial semiconductor layer and the second epitaxial semiconductor layer to the first selective etching process respectively through the first opening and the second opening in the interlayer dielectric layer.

14. The method of claim 13 further comprising:
after forming the first silicide layer, depositing a metal fill layer in the first opening and the second opening in the interlayer dielectric layer;
recessing the metal fill layer inside the first opening and the second opening in the interlayer dielectric layer; and
before removing the second epitaxial semiconductor layer, removing the metal fill layer from the second opening in the interlayer dielectric layer.

15. The method of claim 1 wherein the first source/drain region comprises silicon-germanium doped to have p-type conductivity type, the second source/drain region comprises silicon doped to have n-type conductivity type, the first metal comprises nickel or a combination of nickel and platinum, and the second metal comprises titanium.

16. The method of claim 1 further comprising:
forming a first plurality of nanosheet channel layers arranged in a first layer stack; and
forming a second plurality of nanosheet channel layers arranged in a second layer stack,
wherein the first source/drain region is epitaxially grown from the first plurality of nanosheet channel layers, and the second source/drain region is epitaxially grown from the second plurality of nanosheet channel layers.

17. A structure comprising:
a first field-effect transistor including a first source/drain region with a top surface and one or more side surfaces;
a second field-effect transistor including a second source/drain region with a top surface and one or more side surfaces;
a first contact including a lower portion coupled with the first source/drain region and an upper portion coupled by the lower portion with the first source/drain region, the lower portion of the first contact including a first silicide layer arranged to wrap around the top surface and the one or more side surfaces of the first source/drain region, and the upper portion of the first contact including a first portion of a metallization layer; and
a second contact including a lower portion coupled with the second source/drain region and an upper portion coupled by the lower portion with the second source/drain region, the lower portion of the second contact including a second silicide layer arranged to wrap around the top surface and the one or more side surfaces of the second source/drain region, and the upper portion of the second contact including a second portion of the metallization layer,
wherein the first silicide layer comprises a first metal, the first silicide layer comprises a second metal different from the first metal, and the first portion and the second portion of the metallization layer comprises a third metal different from the first metal and the second metal.

18. The structure of claim 17 wherein the upper portion of the first contact includes a metal fill layer that is arranged between the first silicide layer and the first portion of the metallization layer.

19. The structure of claim 17 wherein the first source/drain region comprises silicon-germanium doped to have p-type conductivity type, the second source/drain region comprises silicon doped to have n-type conductivity type, the first metal comprises nickel or a combination of nickel and platinum, the second metal comprises titanium, and the third metal comprises cobalt or ruthenium.

20. The structure of claim 17 further comprising:
a first body feature including a first plurality of nanosheet channel layers arranged in a first layer stack; and
a second body feature including a second plurality of nanosheet channel layers arranged in a second layer stack, wherein the first source/drain region is epitaxially grown from the first plurality of nanosheet channel layers in the first layer stack, and the second source/drain region is epitaxially grown from the second plurality of nanosheet channel layers in the second layer stack.

* * * * *

UNITED STATES PATENT AND TRADEMARK OFFICE
CERTIFICATE OF CORRECTION

PATENT NO. : 10,276,442 B1
APPLICATION NO. : 15/993017
DATED : April 30, 2019
INVENTOR(S) : Ruilong Xie et al.

Page 1 of 1

It is certified that error appears in the above-identified patent and that said Letters Patent is hereby corrected as shown below:

In the Claims
At Column 16, Claim No. 17, Line number 46, change "first" to --second--.

Signed and Sealed this
Fifth Day of May, 2020

Andrei Iancu
*Director of the United States Patent and Trademark Office*